US007015073B2

(12) United States Patent
Houle et al.

(10) Patent No.: US 7,015,073 B2
(45) Date of Patent: Mar. 21, 2006

(54) METHOD OF FORMING HEAT SPREADER WITH DOWN SET LEG ATTACHMENT FEATURE

(75) Inventors: Sabina J. Houle, Phoenix, AZ (US); Nick Labanok, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/807,220

(22) Filed: Mar. 22, 2004

(65) Prior Publication Data

US 2004/0173897 A1 Sep. 9, 2004

Related U.S. Application Data

(62) Division of application No. 10/118,220, filed on Apr. 5, 2002, now Pat. No. 6,756,669.

(51) Int. Cl.
*H01L 21/44* (2006.01)

(52) U.S. Cl. .......................... 438/122; 438/22; 438/24; 438/117; 438/124; 438/125; 438/126; 257/625; 257/706; 257/707; 257/712; 257/796

(58) Field of Classification Search ..................... None
See application file for complete search history.

(56) References Cited

U.S. PATENT DOCUMENTS 4,748,538 A 5/1988 Tsuji .......................... 361/386
5,949,137 A * 9/1999 Domadia et al. ........... 257/712
6,191,360 B1 2/2001 Tao et al. .................. 174/52.4
6,271,058 B1 8/2001 Yoshida ...................... 438/108
6,462,410 B1 10/2002 Novotmy et al. ........... 257/707
6,483,169 B1 * 11/2002 Tosaya et al. ............. 257/565
6,512,675 B1 * 1/2003 Tarter et al. ................ 361/714
6,525,420 B1 * 2/2003 Zuo et al. .................... 257/715
6,538,320 B1 3/2003 Tosaya et al. ............. 257/706

FOREIGN PATENT DOCUMENTS

DE 29914753 12/1999
EP 0359928 3/1990
JP 59188944 10/1984
JP 59188944 A * 10/1984
JP 01191453 8/1989
JP 07183434 7/1995

OTHER PUBLICATIONS

"Surface-Mounted Heat Sink Attach for Tab", *IBM Technical Disclosure Bulletin, IBM Corp., New York, U.S.* (vol. 33, No. 3B), (Aug. 1, 1990), 101-103.

* cited by examiner

*Primary Examiner*—Andy Huynh
(74) *Attorney, Agent, or Firm*—Schwegman, Lundberg, Woessner & Kluth, P.A.

(57) ABSTRACT

Numerous embodiments of a heat spreader, comprised of a plurality of downset legs, which provides a simple and lower cost method of forming a heat spreader as compared to conventional methods are disclosed, as well as novel apparatus and methods for attaching the heat spreader to a substrate and a secondary device to the heat spreader, are disclosed.

21 Claims, 4 Drawing Sheets

METHOD OF FORMING HEAT SPREADER WITH DOWN SET LEG ATTACHMENT FEATURE

This application is a divisional of U.S. 10/118,220, filed Apr. 5, 2002, now issued as U.S. Pat. No. 6,756,669, which is incorporated herein by reference in its entirety.

BACKGROUND

1. Field

This disclosure relates generally to microelectronic technology, and more specifically, to apparatus used for heat dissipation in a microelectronic package and methods of fabricating the same.

2. Background Information

Recently, there has been rapid development in microelectronic technology and, as a result, microelectronic components are becoming smaller and circuitry within microelectronic components is becoming increasingly dense. As the circuit density increases, heat generation typically increases as well. Thus, heat dissipation is becoming more critical as the technology develops.

Various techniques may typically be used to remove or dissipate heat generated by a microelectronic component, which may also be referred to as a microelectronic die. These techniques may include passive or active solutions. One such technique, which may be classified as a passive solution, involves the use of a mass of conductive material in thermal contact with a microelectronic die. This mass of conductive material may alternatively be referred to as a slug, heat spreader, or integrated heat spreader (IHS). One of the primary purposes of a heat spreader is to spread, or absorb and dissipate the heat generated by a microelectronic die. This may at least in part eliminate “hot spots” within the microelectronic die.

A heat spreader may achieve thermal contact with a microelectronic die by use of a thermally conductive material, such as a thermal interface material (TIM) disposed therebetween. Typical thermal interface materials may include, for example, thermally conductive gels, grease or solders. Heat spreaders are typically constructed of a thermally conductive material such as aluminum, electrolytically plated copper, copper alloy, or ceramic, for example.

Referring now to the figures, where like elements are recited with like designations, there is illustrated numerous embodiments of a microelectronic package. FIGS. 4 and 5 are alternative views of one example of a microelectronic package 200. As is well known, a microelectronic package may comprise at least one microelectronic die 206, coupled to a heat spreader and a substrate 202, such as a printed circuit board (PCB). Package 200 comprises a microelectronic die 206 (see FIG. 4), coupled to a substrate 202, which may also be referred to as a substrate carrier. Secondary electronic components such as capacitors (not shown) may be attached to the substrate 202 as well. Typically, the microelectronic die 206 is attached to one side of the substrate 202, and attachment may be by means of a plurality of solder balls or solder bump connections 210 (see FIG. 4), although alternative attachment methods exist. The package 200 further comprises a mass of thermally conductive material, or heat spreader 204. Heat spreader 204 may be formed out of a suitable conductive material such as copper, aluminum, or carbon composites, although alternative materials exist. In package 200, the heat spreader 204 is typically in thermal contact with the microelectronic die 206 by means of a thermal interface material 208 (see FIG. 4).

A contiguous lip 212 may be formed on the heat spreader 204, and may span around the microelectronic die 206. This lip 212 may serve as an attachment point for the heat spreader 204 to attach to the substrate 202, as well as to provide structural support for the body of the heat spreader 204. Additionally, the heat spreader 204 may provide structural support for the entire package 200, and may, for example, reduce or prevent warpage of the substrate 202. However, this substantially contiguous lip 212 typically does not contribute significantly to heat dissipation, and may add weight and cost to a device package. Additionally, the processes used to manufacture the substantially contiguous lip 212 of a heat spreader 204 may result in a greater variation in flatness of the top side 205 of a heat spreader, which may affect thermal performance due at least in part to a reduced contact surface area between the top side 205 of the heat spreader and a secondary device such as a heat sink. Heat spreader 204 may be attached to substrate 202 by using solder, sealants, or other types of adhesive materials, shown generally by attachment material 214, although alternative attachment methods exist. Heat spreaders, such as heat spreader 204, are typically attached to the substrate 202 by using a sealant 214, which substantially fills the gap between the heat spreader 204 and the substrate 202, and forms a completely enclosed cavity. In operation, heat is typically conducted from the microelectronic die 206 through the thermal interface material 208 to the heat spreader 204 by heat conduction. A vent hole 218 (see FIG. 5) may be formed in the heat spreader, and may provide pressure relief inside the package. A heat sink, such as a folded fin or an extruded pin heat sink, for example (not shown) may be attached to the top side 205 of the heat spreader 204, and in operation, heat is transferred from the heat spreader 204 to the heat sink, and convective heat transfer primarily transfers heat from the heat sink to the surrounding air. Heat sinks are typically attached to a heat spreader 204 by use of an adhesive material, or a mechanical attachment mechanism. Thermal performance may be affected by the method used to attach a heat sink, and depending on which method of attachment is used, such methods may result in heat sinks having a reduced heat transfer capability.

Heat spreaders, such as the one shown in FIGS. 4 and 5, are typically formed from a series of stamping processes, in a multistage manufacturing environment. These stamping processes typically result in a relatively low yield range in the production of heat spreaders, due, at least in part, to the processes used for forming heat spreaders. Additionally, the processes may result in a significant variation in flatness of the top surface 205 of a heat spreader 204, which, as explained previously, may increase the resistance of the package and reduce thermal efficiency. Additionally, the processes as described may affect bond line thickness 207 (see FIG. 4). Bond line thickness 207, or BLT, as is well known, is the distance from the top of a microelectronic die 206 to the bottom of a heat spreader 204 in the assembled microelectronic package 200. In addition to controlling or maintaining a BLT, there is typically a need to control the height of a second level attachment such as a heat sink, which may be a heat sink such as the types previously described. A greater variation in flatness may make dimensional control of this second level attachment device difficult. This design may additionally result in more costly and/or less effective attachment techniques for both the attachment of the heat spreader 204 to substrate 202, or the attachment of one or more devices such as a heat sink to the heat spreader 204. A need exists for an improved heat spreader design, which addresses at least some of these manufacturing and thermal performance concerns.

BRIEF DESCRIPTION OF THE DRAWINGS

Subject matter is particularly pointed out and distinctly claimed in the concluding portion of the specification. The claimed subject matter, however, both as to organization and method of operation, together with objects, features, and advantages thereof, may best be understood by reference to the following detailed description when read with the accompanying drawings in which:

DETAILED DESCRIPTION

Figure 1:
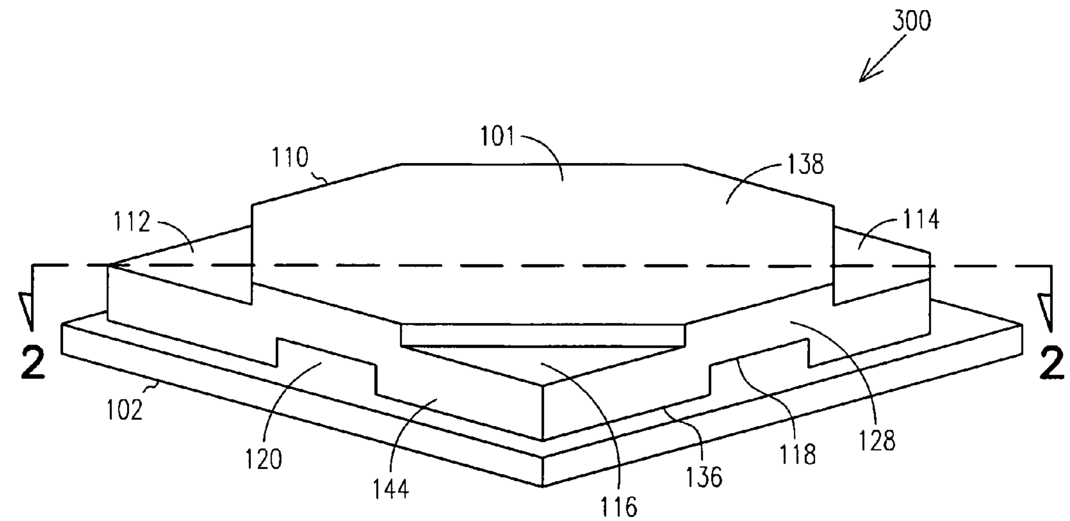
FIG. 1 is an obtuse plan view of one embodiment of the claimed subject matter.
Figure 2:
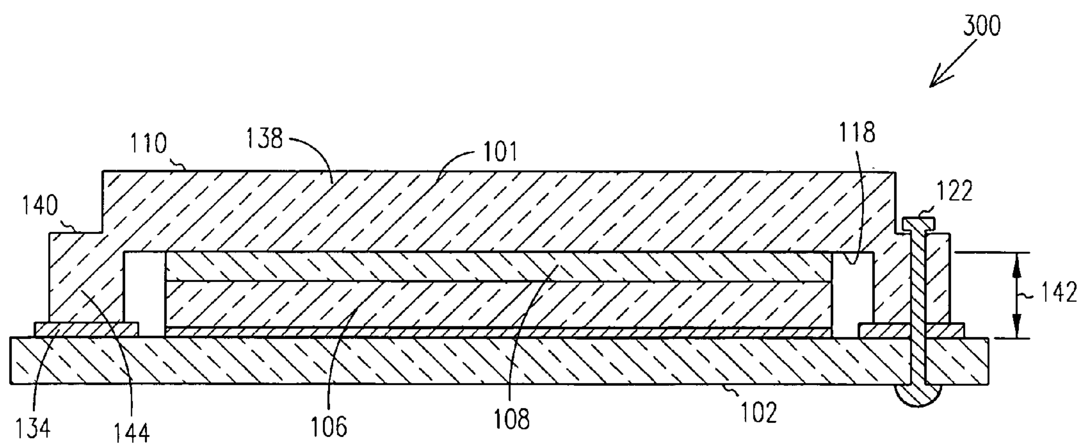
FIG. 2 is a cross sectional diagram of one embodiment of the claimed subject matter.
Figure 5:
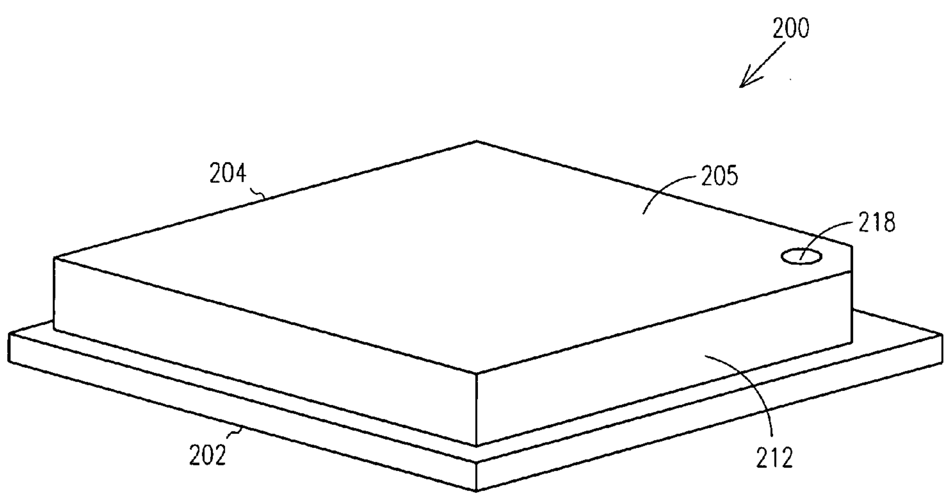
FIG. 5 is an obtuse plan view of a prior art processor package with IHS.

FIGS. 1 and 2 show two different views of a microelectronic package 300, which may address at least some of the previously described manufacturing and thermal performance concerns. The microelectronic package 300 is comprised of a heat spreader 110, which comprises a body 101 with a plurality of downset legs 112, 114 and 116 (see FIG. 2) formed thereon, a substrate 102, and a microelectronic die 106 (see FIG. 2). The present embodiment is shown depicting a plurality of downset legs 112, 114 and 116, although the claimed subject matter is not limited to any particular number of downset legs. One or more of the downset legs 112, 114 or 116 may be formed to be downset from the heat spreader body bottom surface 118 (see FIG. 1) by a particular distance 142 (see FIG. 2), which may form a cavity 120 between the one or more downset legs 112, 114 and 116 and the body bottom surface 118. The offset distance 142 may be approximately as deep as the thickness of microelectronic die 106, for example. A notch 140 may be formed between the top surface 138 of the heat spreader body 101 and one or more heat spreader sides 128, and may be formed from one or more of the forming processes described hereinafter. Additionally, while downset legs 112, 114 and 116 are shown formed on the corners of the heat spreader 110, it will be understood that the plurality of downset legs 112, 114 or 116 may be formed on other areas of the heat spreader 110, and they are not limited to formation on the corners. Referring now to FIG. 1, the plurality of downset legs 112, 114 and 116, in this embodiment, provide an offset of the bottom body surface 118 of the heat spreader 110 to the substrate 102. This offset 118 forms a cavity 120 in the heat spreader 110. The depth of the cavity 120 may be less than or equal to the thickness of microelectronic die 106, but the claimed subject matter is not so limited, and may, for example, be greater than the thickness of the microelectronic die 106. Heat spreader 110 may be attached to a substrate 102, and may be attached by using an attachment material 134 (see FIG. 2), such as a sealant/polymer, which may be applied to at least a portion of the bottom surface 136 of one or more downset legs 112, 114 or 116, although the claimed subject matter is not limited in this respect. When the heat spreader 110 is attached to the substrate 102, the downset legs 112, 114, and 116 may form a non-contiguous lip 144 around the microelectronic die 106. In one embodiment, this non-contiguous lip may eliminate or reduce the need for a vent hole such as vent hole 218 of FIG. 5, which, as stated previously, serves the primary purpose of providing pressure relief inside the package. Additionally, one or more of the discontinuities in the non-contiguous lip 144 of heat spreader 110 may serve as attachment locations for secondary devices, as will be explained in more detail later. Attachment of the heat spreader 110 to the substrate 102 may be by any number of methods, including but not limited to pressing, application of epoxy, soldering, or any suitable method, but the claimed subject matter is not limited in this respect. Additionally, mechanical attachment devices, such as generic mechanical attachment device 122 (see FIG. 2), may be used to attach the heat spreader 110 to the substrate 102, and will be described in more detail later. The top surface 138 of the heat spreader 110 may be substantially planar in one embodiment, but the claimed subject matter is not limited in this respect.

The heat spreader as shown in FIGS. 1 and/or 2, for example, may be formed by use of one or more cold forming processes, such as, for example, one or more stamping processes, although the claimed subject matter is not limited in this respect. As is well known, a stamping process may use a slug of material and then stamp out features or dimensions from a slug of material. In one embodiment, a stamping process may be used to stamp down one or more downset legs 112, 114 and 116, to provide a heat spreader 110 as described. It will, of course, be understood that the claimed subject matter is not limited to any particular process for forming the heat spreader 110 as shown and described, but any suitable method for forming a heat spreader 110 is within the scope of the claimed subject matter. Additionally, the material used to form a heat spreader 110 as shown and described may be any number of materials, and the claimed subject matter is not limited to any particular material or category of materials. There are pluralities of methods, which may be used to form one or more of the heat spreaders 110 as claimed and described. These methods include, for example, stamping, machining, progressive manufacturing, laser cutting, or injection molding, although the claimed subject matter is not limited to any particular method but any method of manufacture capable of producing the heat spreader 110 as claimed and described are within the scope of the claimed subject matter. One such method of forming a heat spreader 110 comprises starting with a mass of material, or slug, and cutting or machining it to a set of dimensions. A subsequent step in the manufacture would comprise one or more stamping processes, which would form the plurality of downset legs 112, 114, and 116. This stamping process may for notch 140 in the vicinity of a formed downset leg. This process may be a single step, or may be a series of steps, and the claimed subject matter is not limited to any particular manufacturing process or series of steps.

Figure 3A:
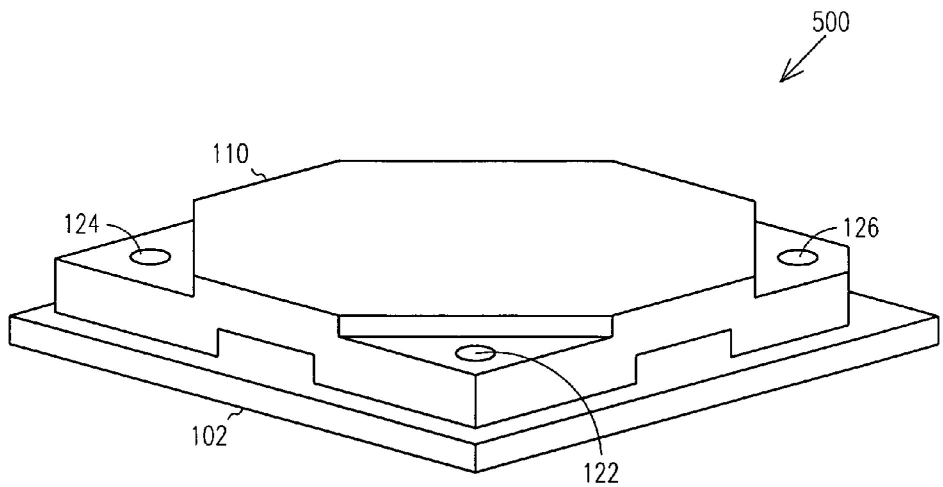
FIG. 3*a* is an obtuse plan view of one embodiment of the claimed subject matter.

FIG. 3*a* comprises a plan view of a microelectronic package in accordance with another embodiment of the claimed subject matter. In this embodiment, the heat spreader 110 has a plurality of holes or voids, such as 124 and 126, located in the vicinity of the downset legs 112, 114 and 116. Holes 124 and 126 are configured to receive one or more pins, bolts, or similar devices such as generic mechanical attachment device 122, for example. These one or more attachment devices 122 may be coupled to substrate 102, although the claimed subject matter is not limited in this respect. Additionally, these one or more attachment devices 122 may be attached to a secondary device such as a heat sink or a temperature-testing device (not shown) which may be configured to be attached to heat spreader 110, for example. The present embodiment of the claimed subject matter is not limited to any particular type of mechanical attachment device and may include, for example pins, screws, bolts or rivets, and any type of mechanical attachment device that may be adapted to be inserted in voids 124 and/or 126. Additionally, one or more types of adhesives known in the art may be used to attach one or more secondary components (not shown) to the heat spreader 110. It will additionally be understood that alternative configurations or methods to attach one or more secondary components to the heat spreader 110 are in accordance with the claimed subject matter. Additionally, a plurality of pins, or other mechanical attachment devices (not shown), may be formed on the heat spreader 110, and may be configured to receive one or more secondary components such as a heat sink (not shown). These one or more attachment devices may be configured to pass through the heat spreader 110, or through the heat spreader 110 and substrate 102.

Figure 3B:
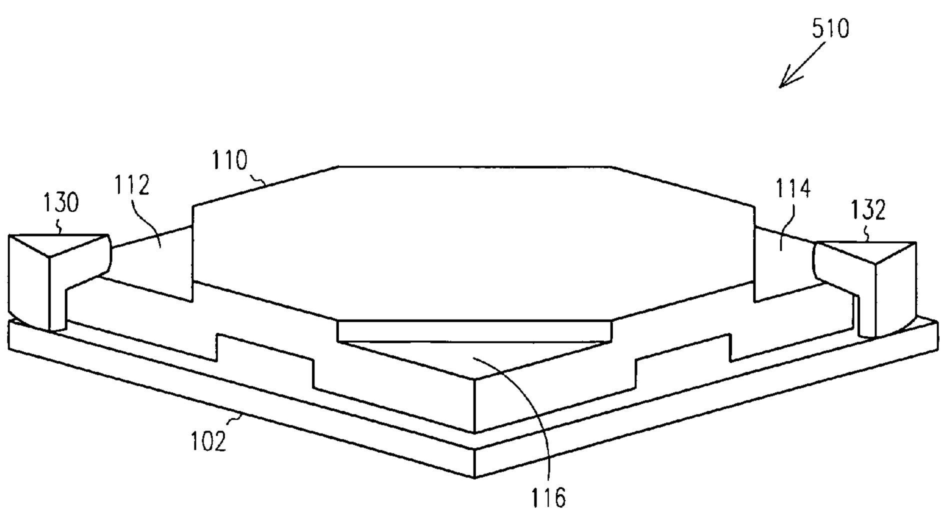
FIG. 3*b* is an obtuse plan view of one embodiment of the claimed subject matter.
Figure 4:
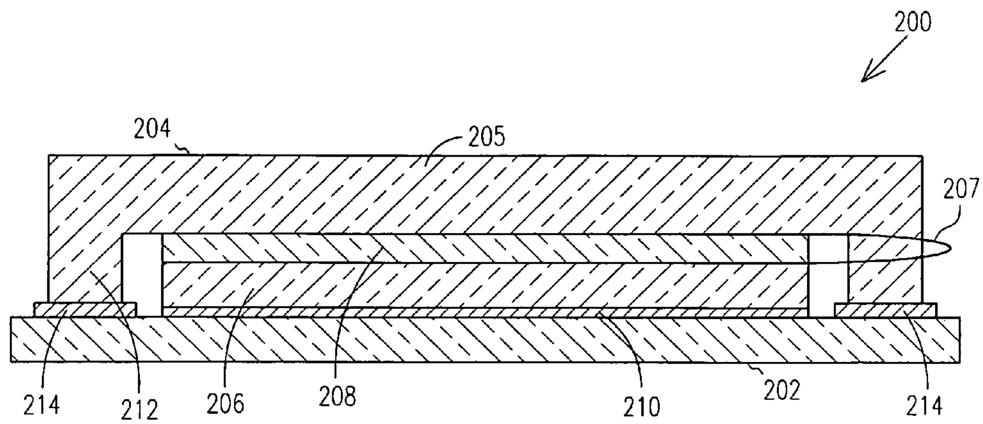
FIG. 4 is a cross sectional diagram of a prior art processor package with IHS.

In yet another alternative embodiment, FIG. 3*b* shows a clip configuration, including clips 130 and 132, although the claimed subject matter is not limited to any particular number of or location of clips. Clips 130 and 132, in this embodiment, may be coupled to the substrate 102, and clipped to the top surfaces of downset legs 112 and 114, although this is just one possible embodiment of a clip attachment, and the claimed subject matter is not so limited. These one or more clips 130 and 132 may be alternatively be attached to the heat spreader 110, and configured to be coupled to a substrate 102 when microelectronic assembly 510 is assembled. Additionally, one or more of the downset legs 112, 114 and 116 may be configured to receive one or more clips such as 130 and 132. These one or more clips may be attached to a secondary component such as a heat sink (not shown), although the claimed subject matter is not limited in this respect. It will, of course, be understood that many such attachment devices or methods exist that are in accordance with at least one embodiment of the claimed subject matter.

For purposes of clarity, the claimed subject matter is described primarily in the context of utilization with an integrated circuit flip chip configuration, packaged with a substrate and heat spreader as shown in the accompanying figures. However, it will be understood that the claimed subject matter is not limited to just this particular configuration, and the claimed subject matter is applicable to other types of microelectronic packages. For example, microelectronic packages in accordance with the claimed subject matter may include packages with varying form factors, such as, for example, pin grid array, ball grid array, ball grid array with pinned interposers and wire bonding, although, again, these are just examples, and the claimed subject matter is not limited in this respect.

Figure 6:
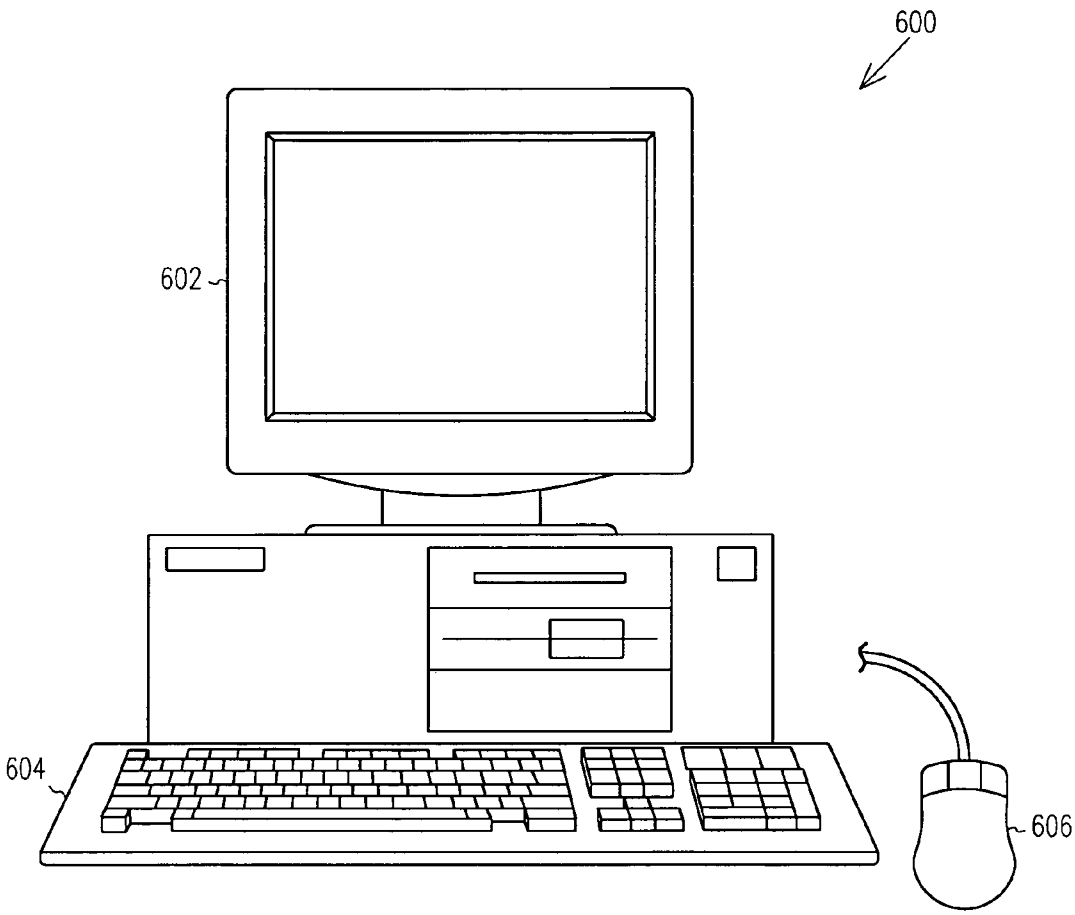
FIG. 6 is a computing system, which may be used with at least one embodiment of the claimed subject matter.

One or more of the foregoing embodiments of a microelectronic package may be utilized in a computing system, such as computing system 600 of FIG. 6. Computing system 600 is comprised of at least one processor (not shown), a data storage system (not shown), at least one input device such as keyboard 604, and at least one output device such as monitor 602, for example. System 600 includes a processor that processes data signals, and may comprise, for example, a PENTIUM®III or PENTIUM® 4 microprocessor, available from Intel® Corporation.

Computing system 600 comprises a keyboard 604, and may include other user input devices such as a mouse 606, for example. Computing system 600 may utilize one or more microelectronic packages such as described in one or more of the foregoing embodiments. For purposes of this application, a computing system embodying components in accordance with the claimed subject matter may include any system that utilizes a microelectronic package, which may include, for example, a digital signal processor (DSP), a microcontroller, an application specific integrated circuit (ASIC), or a microprocessor.

While certain features of the claimed subject matter have been illustrated as described herein, many modifications, substitutions, changes, and equivalents will now occur to those skilled in the art. It is, therefore, to be understood that the appended claims are intended to cover all such embodiments and changes as fall within the true spirit of the claimed subject matter. Additionally, in the preceding detailed description, numerous specific details were set forth in order to provide a thorough understanding of the claimed subject matter. However, it will be understood by those skilled in the art that the claimed subject matter may be practiced without these specific details. In other instances, well-known methods, procedures, and components have not been described in detail so as not to obscure the claimed subject matter.

What is claimed is:

1. A method of forming a heat spreader comprising:

forming a mass of material into a body approximately rectangular in shape having a top surface, a bottom surface and at least one corner; and forming at least three downset legs on the mass of material, wherein the at least three downset legs are formed to be downset from the bottom surface and wherein the at least three downset legs and the bottom surface define a cavity for placement of a microelectronic die, the cavity having a depth less than or equal to a thickness of the die.

2. The method of claim 1, wherein the forming a mass of material comprises at least one cold forming process.

3. The method of claim 1, wherein the method further comprises forming at least one notch on the mass of material, wherein the notch is formed in the vicinity of the corner.

4. The method of claim 1, wherein at least one void is formed on the at least one downset leg, wherein the void is configured to receive at least one mechanical attachment device.

5. The method of claim 1, wherein the at least one downset leg is formed to be configured to receive at least one clamp.

6. The method of claim 1, wherein the at least one downset leg is formed to be configured to received at least one clip.

7. The method of claim 1, further comprising forming at least one notch formed between the top surface and the bottom surface proximate to the at least one corner.

8. A method of forming a heat spreader comprising:

forming a body having a top surface, a bottom surface, at least one side and at least one corner;

forming at least three downset legs formed to be downset from the body bottom surface by a distance wherein the at least three downset legs and the body bottom surface define a cavity between the legs cavity for placement of a microelectronic die, the distance being a depth less than or equal to a thickness of the microelectronic die.

9. The method of claim 8 wherein forming the body includes forming the body with four downset legs formed thereon, and wherein each downset leg is formed proximate to a separate corner of the heat spreader body.

10. The method of claim 8, wherein forming the at least one downset legs further includes forming the downset legs with a void formed therein, and wherein the void is configured to receive at least one mechanical attachment device.

11. The method of claim 8, further including forming at least one downset leg to be configured to receive at least one clip.

12. The method of claim 8, wherein the body and at least one downset leg are comprised of thermally conductive material.

13. The method of claim 8, wherein the cavity is configured to receive at least one microelectronic die.

14. The method of claim 8 wherein forming the body includes forming the body in a rectangular shape.

15. The method of claim 8 wherein forming the body includes forming the body in an octagon shape.

16. A method of forming a heat spreader, comprising:

forming a body having a top surface, a bottom surface, a periphery and at least one side in a shape having a plurality of corners;

forming a plurality of legs extending down from the bottom surface on the periphery of the body and thereby forming a microelectronic die cavity under the bottom surface of the body for placement of a microelectronic die, a depth of the cavity being less than or equal to a thickness of the microelectronic die, the plurality of legs being attached to a non-contiguous lip around the body; and forming a notch between the top surface and the bottom surface in proximity to the at least one corner.

17. The method of claim 16 further including attaching a microelectronic die to the bottom surface of the bottom surface within the cavity.

18. The method of claim 16 wherein forming a plurality of legs includes forming each of the plurality of legs in a corresponding one of the plurality of corners.

19. The method of claim 18 further including forming a mechanical attachment mechanism in each of the plurality of corners.

20. The method of claim 19 further including forming a notch in the top surface of the body in each of the plurality of corners.

21. The method of claim 20 wherein the top surface is approximately rectangular in shape.

* * * * *

UNITED STATES PATENT AND TRADEMARK OFFICE

CERTIFICATE OF CORRECTION

PATENT NO. : 7,015,073 B2
APPLICATION NO. : 10/807220
DATED : March 21, 2006
INVENTOR(S) : Houle et al.

It is certified that error appears in the above-identified patent and that said Letters Patent is hereby corrected as shown below:

Title page,
Item [56], References Cited, FOREIGN PATENT DOCUMENTS,
after "12/1999" insert -- H05K/7/20 --.
after "3/1990" insert -- H01L/23/40 --.
after "10/1984" insert -- H01L/23/12 --.
after "10/1984" insert -- H01L/23/12 --.
after "8/1989" insert -- H01L/23/02 --.
after "7/1995" insert -- H01L/23/373 --.

Column 6,
Line 54, delete "received" and insert -- receive --.

Signed and Sealed this

Twentieth Day of June, 2006

JON W. DUDAS
*Director of the United States Patent and Trademark Office*